US009869733B2

(12) United States Patent
Ma et al.

(10) Patent No.: US 9,869,733 B2
(45) Date of Patent: *Jan. 16, 2018

(54) SUPERCONDUCTOR MAGNETIC RESONANCE IMAGING SYSTEM AND METHOD (SUPER-MRI)

(75) Inventors: Qiyuan Ma, Milburn, NJ (US); Erzhen Gao, Milburn, NJ (US)

(73) Assignee: Time Medical Holdings Company Limited, George Town (KY)

(*) Notice: Subject to any disclaimer, the term of this patent is extended or adjusted under 35 U.S.C. 154(b) by 468 days.

This patent is subject to a terminal disclaimer.

(21) Appl. No.: 13/595,747

(22) Filed: Aug. 27, 2012

(65) Prior Publication Data
US 2012/0319690 A1 Dec. 20, 2012

Related U.S. Application Data

(63) Continuation of application No. 12/416,606, filed on Apr. 1, 2009, now Pat. No. 8,253,416.
(Continued)

(51) Int. Cl.
*G01R 33/3815* (2006.01)
*G01R 33/385* (2006.01)
(Continued)

(52) U.S. Cl.
CPC ..... *G01R 33/3815* (2013.01); *G01R 33/3403* (2013.01); *G01R 33/3804* (2013.01);
(Continued)

(58) Field of Classification Search
USPC ............. 324/300–322; 600/407–435; 382/128–131
See application file for complete search history.

(56) References Cited

U.S. PATENT DOCUMENTS 4,652,824 A 3/1987 Oppelt
5,144,243 A 9/1992 Nakabayashi et al.
(Continued)

FOREIGN PATENT DOCUMENTS

EP 0 562 708 A1 9/1993
FR 2 622 427 A1 5/1989
GB 2 301 674 A 12/1996

OTHER PUBLICATIONS

Jing Yuan and G X Shen, "Gradient coil design using Bi-2223 high temperature superconducting tapefor magnetic resonance imaging," Medical Engineering & Physics, 2007, pp. 442-448, vol. 29, Butterworth-Heinemann, GB.
(Continued)

*Primary Examiner* — Melissa Koval
*Assistant Examiner* — Tiffany Fetzner

(57) ABSTRACT

Methods and apparatuses for magnetic resonance imaging (MRI) and/or magnetic resonance spectroscopy comprising a superconducting main magnet operable to generate a uniform magnetic field in an examination region, at least one superconducting gradient field coil operable to apply a respective at least one magnetic field gradient within the examination region, and at least one RF coil that is operable to transmit and receive radio frequency signals to and from the examination region, and that is configured for cooling and comprises at least one of (i) a non-superconducting material that when cooled to a temperature below room temperature has a conductivity higher than that of copper at that temperature and (ii) a superconducting material. The main magnet, the gradient coils, and each of the at least one RF coil of a given system may each be implemented as high temperature superconductor materials.

17 Claims, 7 Drawing Sheets

Related U.S. Application Data

(60) Provisional application No. 61/159,008, filed on Mar. 10, 2009.

(51) Int. Cl.
  *G01R 33/38* (2006.01)
  *G01R 33/34* (2006.01)

(52) U.S. Cl.
  CPC ....... *G01R 33/385* (2013.01); *G01R 33/3856* (2013.01); *G01R 33/34023* (2013.01)

(56) References Cited

U.S. PATENT DOCUMENTS

| | | | |
|---|---|---|---|
| 5,289,128 A | 2/1994 | DeMeester et al. | |
| 5,661,445 A | 8/1997 | Larson, III et al. | |
| 5,793,210 A | 8/1998 | Pla et al. | |
| 6,411,092 B1 | 6/2002 | Anderson | |
| 6,463,316 B1 | 10/2002 | Brungart | |
| 6,806,712 B2* | 10/2004 | Akgun | 324/318 |
| 6,879,852 B1 | 4/2005 | Mueller | |
| 6,943,550 B2* | 9/2005 | Cheng et al. | 324/318 |
| 7,042,216 B2 | 5/2006 | Barbic | |
| 7,518,370 B2 | 4/2009 | Huang et al. | |
| 7,759,935 B2 | 7/2010 | DeVries et al. | |
| 8,253,416 B2* | 8/2012 | Ma et al. | 324/318 |
| 8,593,146 B2* | 11/2013 | Gao | G01R 33/3858 |
| | | | 324/318 |
| 8,723,522 B2* | 5/2014 | Ma | G01R 33/34007 |
| | | | 324/318 |
| 9,170,310 B2* | 10/2015 | Ma | G01R 33/34023 |
| 2003/0094947 A1* | 5/2003 | Akgun | 324/318 |
| 2004/0066194 A1* | 4/2004 | Slade | G01R 33/3808 |
| | | | 324/318 |
| 2004/0222186 A1* | 11/2004 | Cheng et al. | 216/43 |
| 2009/0189721 A1 | 7/2009 | Chiba et al. | |
| 2010/0231215 A1* | 9/2010 | Ma et al. | 324/307 |
| 2010/0248968 A1 | 9/2010 | Stautner | |
| 2011/0011102 A1* | 1/2011 | Gao | G01R 33/3403 |
| | | | 62/51.1 |
| 2011/0012599 A1* | 1/2011 | Gao | G01R 33/3858 |
| | | | 324/318 |
| 2011/0015078 A1* | 1/2011 | Gao | G01R 33/3403 |
| | | | 505/162 |
| 2011/0121830 A1* | 5/2011 | Ma | G01R 33/34007 |
| | | | 324/318 |
| 2012/0319690 A1* | 12/2012 | Ma et al. | 324/322 |
| 2013/0063148 A1* | 3/2013 | Ma | G01R 33/34023 |
| | | | 324/318 |
| 2015/0077116 A1* | 3/2015 | Ma | G01R 33/34007 |
| | | | 324/322 |

OTHER PUBLICATIONS

R.D. Black et al, A High Temperature Superconducting Receiver the Nuclear Magnetic Resonance Microscopy, Science, 1993, pp. 793-795, vol. 259.

PCT International Search Report dated Jun. 24, 2010 in counterpart International Application No. PCT/US2010/026811, filed Mar. 10, 2010.

PCT Written Opinion of the International Searching Authority dated Jun. 24, 2010 in counterpart International Application No. PCT/US2010/026811, filed Mar. 10, 2010.

PCT International Search Report dated Jun. 21, 2010 in International Application No. PCT/US2010/031611, filed Apr. 19, 2010.

PCT Written Opinion of the International Searching Authority dated Jun. 21, 2010 in International Application No. PCT/US2010/031611, filed Apr. 19, 2010.

Espacenet English-language Abstract of FR2622427A1, May 5, 1989.

* cited by examiner

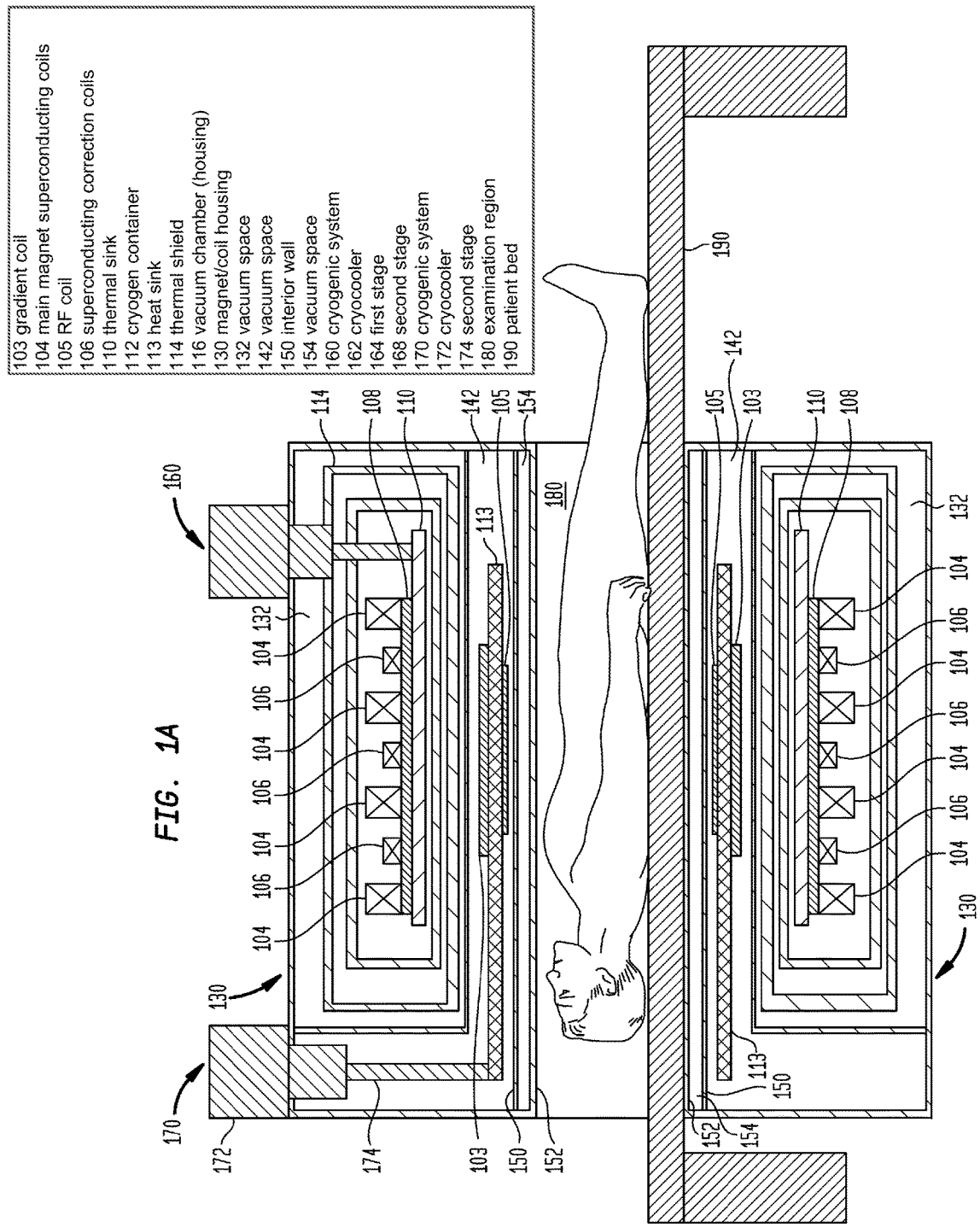

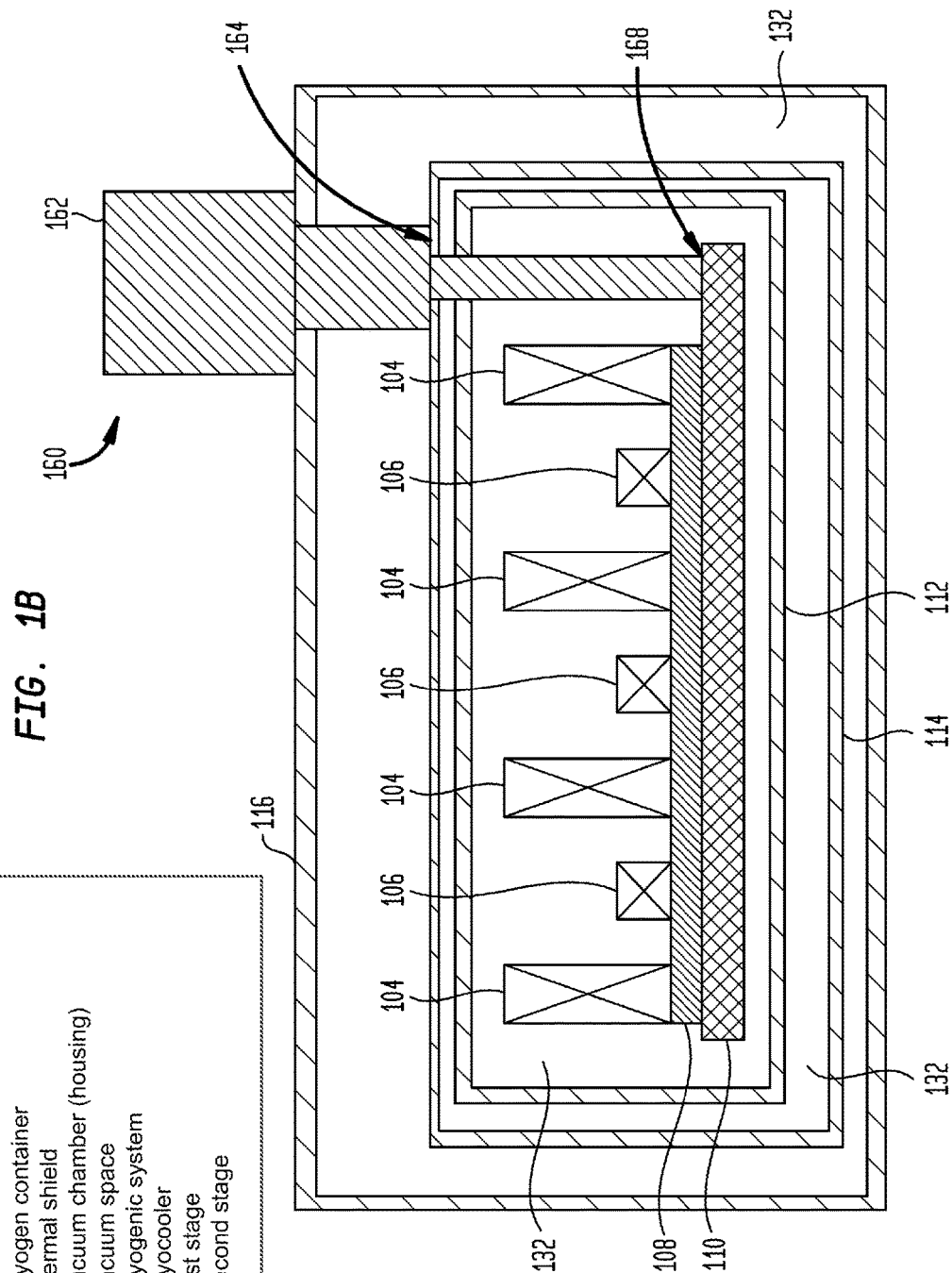

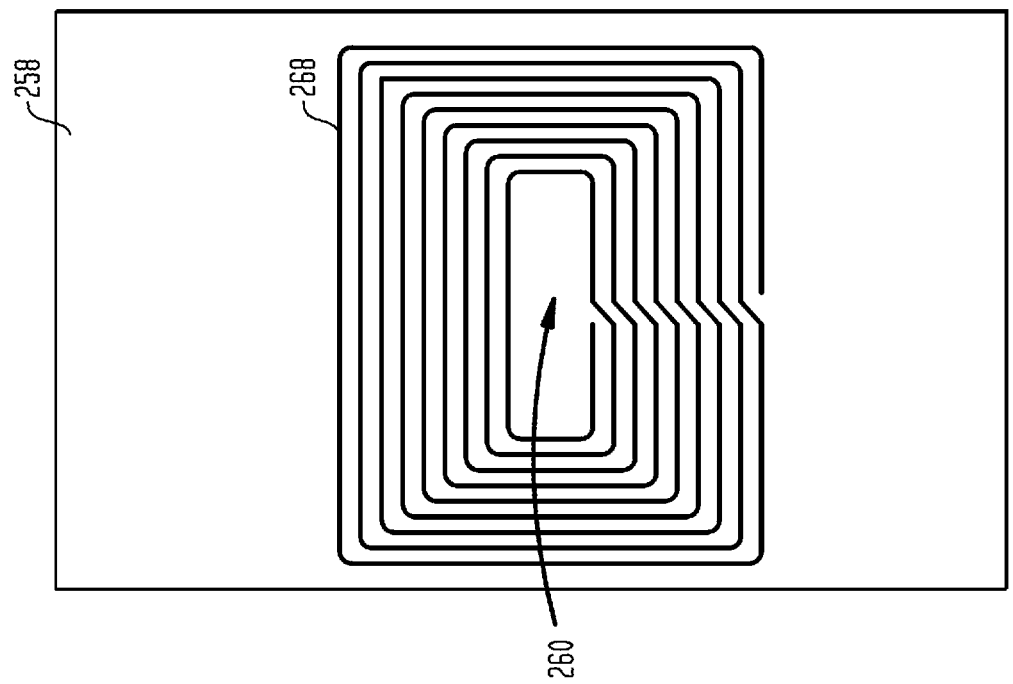
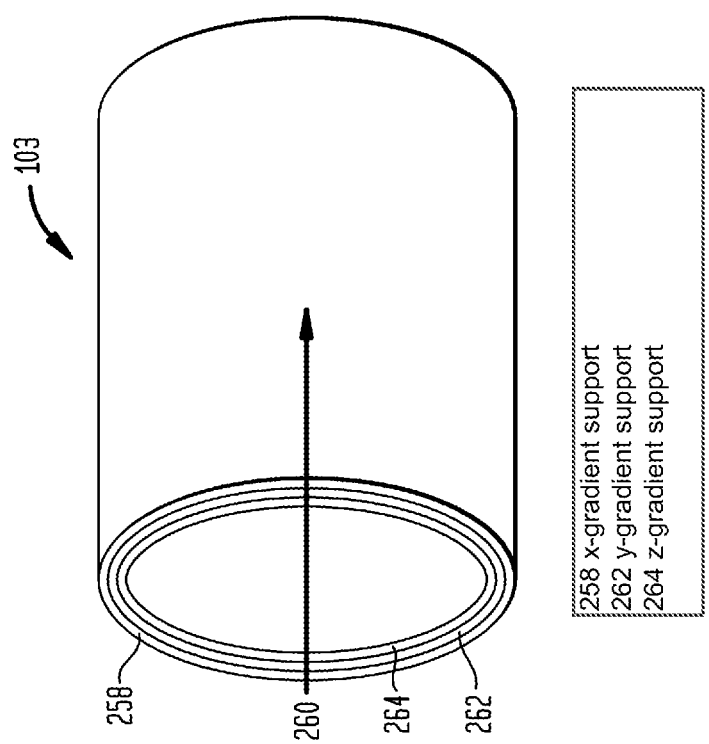

300 MRI coil configuration (end view)
302 HTS main magnet coils
304 HTS gradient coil(s)
306 HTS RF coil(s)
308 wall
310 wall
312 wall
314 second vacuum chamber
316 first vacuum chamber

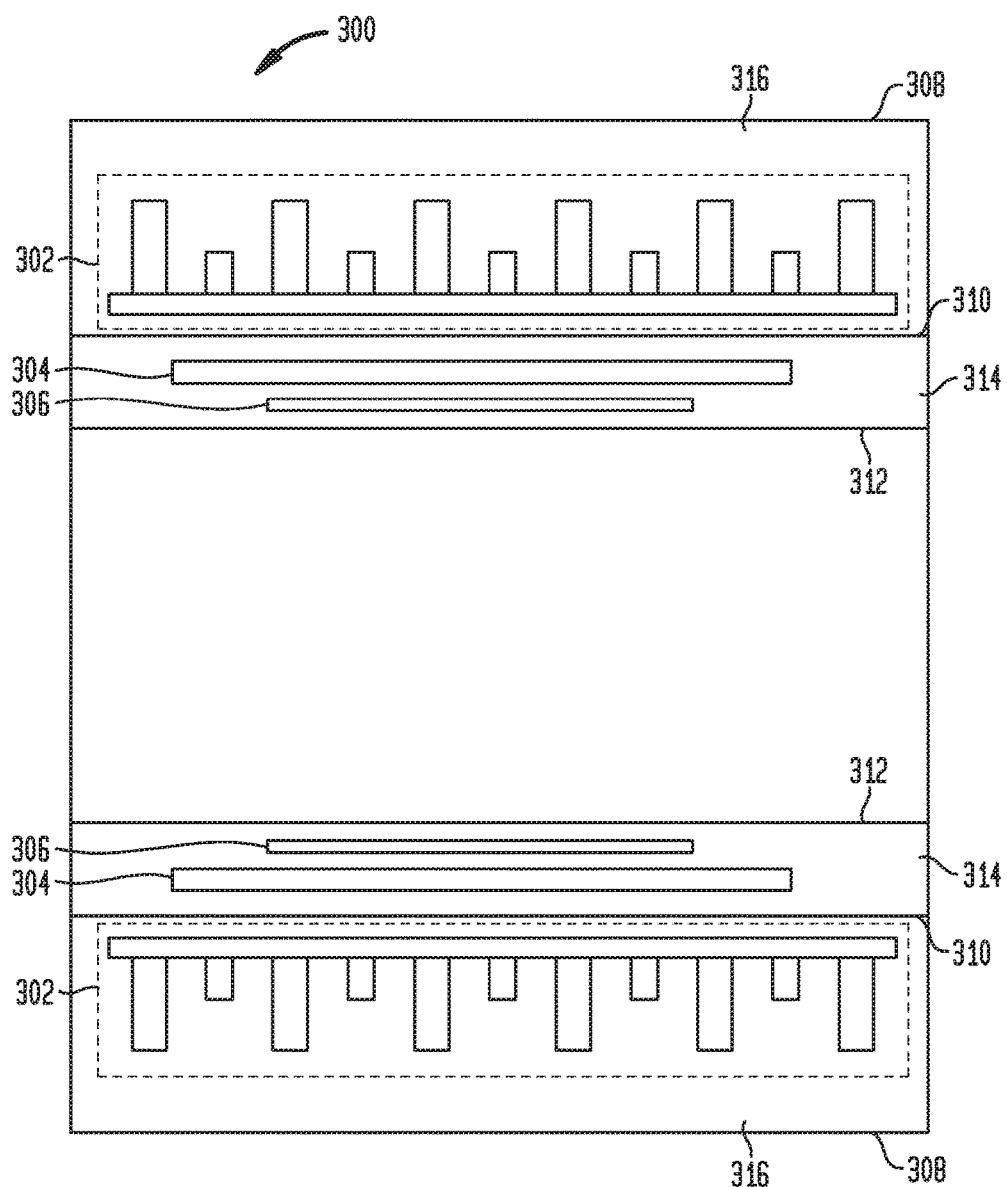

SUPERCONDUCTOR MAGNETIC RESONANCE IMAGING SYSTEM AND METHOD (SUPER-MRI)

CROSS-REFERENCE TO RELATED APPLICATIONS

This application is a continuation of U.S. application Ser. No. 12/416,606, filed Apr. 1, 2009, which claims the benefit of U.S. Provisional Application No. 61/159,008, filed Mar. 10, 2009, each of which is hereby incorporated by reference herein in its entirety.

TECHNICAL FIELD

The present invention relates generally to magnetic resonance imaging and spectroscopy, and, more particularly, to magnetic resonance imaging and spectroscopy apparatus employing superconductor components, and to methods for manufacturing such apparatus.

BACKGROUND

Magnetic Resonance Imaging (MRI) technology is commonly used today in larger medical institutions worldwide, and has led to significant and unique benefits in the practice of medicine. While MRI has been developed as a well-established diagnostic tool for imaging structure and anatomy, it has also been developed for imaging functional activities and other biophysical and biochemical characteristics or processes (e.g., blood flow, metabolites/metabolism, diffusion), some of these magnetic resonance (MR) imaging techniques being known as functional MRI, spectroscopic MRI or Magnetic Resonance Spectroscopic Imaging (MRSI), diffusion weighted imaging (DWI), and diffusion tensor imaging (DTI). These magnetic resonance imaging techniques have broad clinical and research applications in addition to their medical diagnostic value for identifying and assessing pathology and determining the state of health of the tissue examined.

During a typical MRI examination, a patient's body (or a sample object) is placed within the examination region and is supported by a patient support in an MRI scanner where a substantially constant and uniform primary (main) magnetic field is provided by a primary (main) magnet. The magnetic field aligns the nuclear magnetization of precessing atoms such as hydrogen (protons) in the body. A gradient coil assembly within the magnet creates a small variation of the magnetic field in a given location, thus providing resonance frequency encoding in the imaging region. A radio frequency (RF) coil is selectively driven under computer control according to a pulse sequence to generate in the patient a temporary oscillating transverse magnetization signal that is detected by the RF coil and that, by computer processing, may be mapped to spatially localized regions of the patient, thus providing an image of the region-of-interest under examination.

In a common MRI configuration, the static main magnetic field is typically produced by a solenoid magnet apparatus, and a patient platform is disposed in the cylindrical space bounded by the solenoid windings (i.e. the main magnet bore). The windings of the main field are typically implemented as a low temperature superconductor (LTS) material, and are super-cooled with liquid helium in order to reduce resistance, and, therefore, to minimize the amount of heat generated and the amount of power necessary to create and maintain the main field. The majority of existing LTS superconducting MRI magnets are made of a niobium-titanium (NbTi) and/or $Nb_3Sn$ material which is cooled with a cryostat to a temperature of 4.2 K.

As is known to those skilled in the art, the magnetic field gradient coils generally are configured to selectively provide linear magnetic field gradients along each of three principal Cartesian axes in space (one of these axes being the direction of the main magnetic field), so that the magnitude of the magnetic field varies with location inside the examination region, and characteristics of the magnetic resonance signals from different locations within the region of interest, such as the frequency and phase of the signals, are encoded according to position within the region (thus providing for spatial localization). Typically, the gradient fields are created by current passing through coiled saddle or solenoid windings, which are affixed to cylinders concentric with and fitted within a larger cylinder containing the windings of the main magnetic field. Unlike the main magnetic field, the coils used to create the gradient fields typically are common room temperature copper windings. The gradient strength and field linearity are of fundamental importance both to the accuracy of the details of the image produced and to the information on tissue chemistry (e.g., in MRSI).

Since MRI's inception, there has been a relentless pursuit for improving MRI quality and capabilities, such as by providing higher spatial resolution, higher spectral resolution (e.g., for MRSI), higher contrast, and faster acquisition speed. For example, increased imaging (acquisition) speed is desired to minimize imaging blurring caused by temporal variations in the imaged region during image acquisition, such as variations due to patient movement, natural anatomical and/or functional movements (e.g., heart beat, respiration, blood flow), and/or natural biochemical variations (e.g., caused by metabolism during MRSI). Similarly, for example, because in spectroscopic MRI the pulse sequence for acquiring data encodes spectral information in addition to spatial information, minimizing the time required for acquiring sufficient spectral and spatial information to provide desired spectral resolution and spatial localization is particularly important for improving the clinical practicality and utility of spectroscopic MRI.

Several factors contribute to better MRI image quality in terms of high contrast, resolution, and acquisition speed. An important parameter impacting image quality and acquisition speed is the signal-to-noise ratio (SNR). Increasing SNR by increasing the signal before the preamplifier of the MRI system is important in terms of increasing the quality of the image. One way to improve SNR is to increase the magnetic field strength of the magnet as the SNR is proportional to the magnitude of the magnetic field. In clinical applications, however, MRI has a ceiling on the field strength of the magnet (the US FDA's current ceiling is 3 T (Tesla)). Other ways of improving the SNR involve, where possible, reducing sample noise by reducing the field-of-view (where possible), decreasing the distance between the sample and the RF coils, and/or reducing RF coil noise.

Despite the relentless efforts and many advancements for improving MRI, there is nevertheless a continuing need for yet further improvements in MRI, such as for providing greater contrast, improved SNR, higher acquisition speeds, higher spatial and temporal resolution, and/or higher spectral resolution.

Additionally, a significant factor affecting further use of MRI technology is the high cost associated with high magnetic field systems, both for purchase and maintenance. Thus, it would be advantageous to provide a high quality MRI imaging system that is capable of being manufactured and/or maintained at reasonable cost, permitting MRI technology to be more widely used.

SUMMARY OF INVENTION

Various embodiments of the present invention provide methods and apparatuses for magnetic resonance imaging (MRI) and/or magnetic resonance spectroscopy comprising: a superconducting main magnet operable to generate a uniform magnetic field in an examination region; at least one superconducting gradient field coil operable to apply a respective at least one magnetic field gradient within the examination region; and at least one RF coil that is operable to transmit and receive radio frequency signals to and from the examination region, and that is configured for cooling and comprises at least one of (i) a non-superconducting material that when cooled to a temperature below room temperature has a conductivity higher than that of copper at said temperature, and (ii) a superconducting material.

In accordance with some embodiments of the present invention, the main magnet, the gradient coils, and the RF coil are each implemented as superconductors using high temperature superconductor materials. In alternative embodiments, the superconducting main magnet, and/or one or more of the at least one superconducting gradient field coil, and/or the RF coil are all formed from a low temperature superconducting material.

In accordance with some aspects of the present invention, the at least one gradient coil and the at least one RF coil are disposed in at least one vacuum chamber having at least one non-magnetic and non-metallic wall disposed between the examination region and the gradient coil and the at least one RF coil. Additionally, the at least one gradient coil and the at least on RF coil may be disposed in a common vacuum chamber comprising said at least one non-magnetic and non-metallic wall. A further vacuum chamber may be disposed between the common vacuum chamber and the examination region, wherein the further vacuum chamber comprises (i) a first wall formed from the at least one non-magnetic and non-metallic wall of the common vacuum chamber, and (ii) a second non-magnetic and non-metallic wall spaced away from said first wall.

In accordance with some aspects of the present invention, the main magnet may be disposed in a first vacuum chamber, and the at least one RF coil and the at least one gradient coil may be disposed in a second vacuum chamber. Alternatively, in some embodiments, the main magnet, the at least one RF coil, and the at least one gradient coil may be disposed in respective vacuum chambers.

In accordance with various aspects of the present invention, the at least one RF coil may be implemented as a two-dimensional electron gas structure and/or as a carbon nanotube structure. In some embodiments, the at least one RF coil may comprise a coil array.

In accordance with various embodiments, one or more cooling systems may be used for cooling the main magnet, the at least one gradient coil, and the at least one RF coil. In some embodiments, the superconducting main magnet is configured for cooling by a first cryogenic cooling system, the at least one RF coil is configured for cooling by a second cryogenic cooling system, and the at least one gradient coil is configured for cooling by a third cryogenic cooling system. In some embodiments, the superconducting main magnet is configured for cooling by a first cryogenic cooling system, and the at least one RF coil and the at least one gradient coil are configured for cooling by a second cryogenic cooling system. In some embodiments, the superconducting main magnet, the at least one RF coil, and the at least one gradient coil are configured for cooling by a common cryogenic cooling system.

In accordance with some aspects of the present invention, the at least one superconducting gradient field coil comprises three superconducting gradient field coils that are configured to provide magnetic field gradients in three respective orthogonal directions, one of the directions being along the direction of the uniform magnetic field in the examination region.

In accordance with various aspects of the present invention, a method for magnetic resonance imaging comprises applying a uniform magnetic filed in an examination region using a superconducting main magnet, applying at least one magnetic field gradient within the examination region using at least one respective superconducting gradient field coil, and transmitting and receiving radio frequency signals to and from the examination region using at least one RF coil that is configured for cooling and comprises at least one of (i) a non-superconducting material that when cooled to a temperature below room temperature has a conductivity higher than that of copper at that temperature and (ii) a superconducting material. The superconducting main magnet, each of the at least one superconducting gradient field coil, and each of the at least one superconducting RF coil may all be formed from an HTS material. The at least one superconducting gradient field coil may comprise three superconducting gradient field coils that are configured to provide magnetic field gradient in three orthogonal directions, one of the directions being along the direction of the uniform magnetic field in the examination region.

It will be appreciated by those skilled in the art that the foregoing brief description and the following detailed description are exemplary and explanatory of the present invention, but are not intended to be restrictive thereof or limiting of the advantages which can be achieved by this invention. Additionally, it is understood that the foregoing summary of the invention is representative of some embodiments of the invention, and is neither representative nor inclusive of all subject matter and embodiments within the scope of the present invention. Thus, the accompanying drawings, referred to herein and constituting a part hereof, illustrate embodiments of this invention, and, together with the detailed description, serve to explain principles of this invention.

BRIEF DESCRIPTION OF THE DRAWINGS

Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures, and wherein:

FIG. 1A schematically depicts a schematic cross-sectional view of an illustrative superconductor MRI system, in accordance with an embodiment of the present invention;

FIG. 1B schematically depicts in more detail the upper cross-sectional portion of the main magnet system shown in FIG. 1A, in accordance with an embodiment of the present invention;

FIG. 2A schematically depicts in more detail an oblique view of the gradient coil configuration of the illustrative superconductor MRI system of FIG. 1A, in accordance with an embodiment of the present invention;

FIG. 2B schematically illustrates a cylindrical x-oriented gradient coil of FIG. 2A depicted in a plan view, in accordance with an embodiment of the present invention;

FIGS. 4A and 4B illustrate cross sectional views of an illustrative coil configuration associated with a superconducting MRI system employing a cylindrical, solenoid main magnet structure, in accordance with some embodiments of the present invention.

DESCRIPTION OF EMBODIMENTS OF THE INVENTION

Figure 3B:
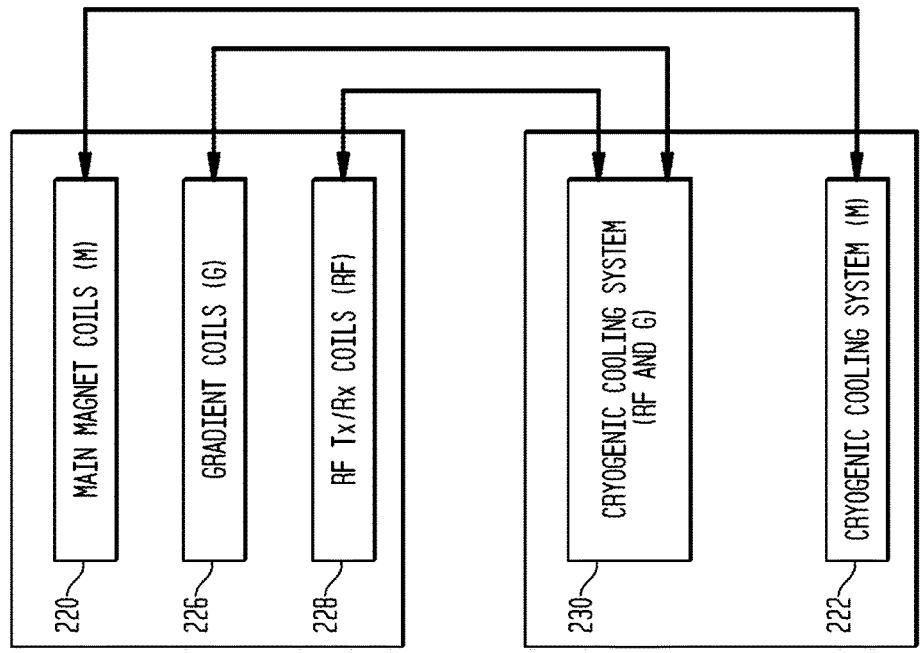
FIGS. 3A-3D schematically depict different examples of cooling configurations that may be used within an MRI system according to various embodiments of the present invention.

As will be understood by those skilled in the art, while the ensuing description is set forth in the context of an MRI system that may be used for examining a patient, embodiments of the present invention include systems and methods for magnetic resonance spectroscopy. Additionally, as used herein, MRI includes and embraces magnetic resonance spectroscopic imaging.

FIG. 1A schematically depicts a schematic cross-sectional view of an illustrative superconductor MRI system 100 in accordance with an embodiment of the present invention. Superconductor MRI system 100 includes an examination region 180; a movable patient bed 190; a magnet/coil housing 130; a main magnet system (shown in more detail in FIG. 1B) comprising (i) a main magnet that includes superconducting coils 104, superconducting correction coils 106, and a coil frame 108, (ii) thermal sink 110, (iii) cryogen container 112, (iv) thermal shield 114, (v) main magnet vacuum chamber housing 116, and (vi) cryogenic system 160. The movable patient bed 190 can be slid in and out of the examination region. At least the portion of the patient bed 190 which is located in the main magnetic field is made of non-metallic and non-magnetic material such as plastic.

In the embodiment of FIGS. 1A and 1B, the superconductor main magnet system is implemented as a solenoid magnet that generates a substantially uniform, horizontal magnetic field in the range of, for example, about 0.5 T (Tesla) to 10 T in the examination region. In alternative embodiments, the main magnet system may be implemented as configuration other than a solenoid and/or may be implemented as an open magnet, such as vertical magnet or a double-donut magnet, and/or may be implemented using lower fields (e.g., 0.1 T to 0.5 T) depending on the design and/or application. Typically, however, the direction of a low magnetic field can be oriented in a desired direction, for example, perpendicular to the patient bed (e.g., vertically), while the direction of a high field is usually horizontal.

As noted above, FIG. 1B schematically depicts in more detail the upper cross-sectional portion of the main magnet system shown in FIG. 1A. As shown, vacuum chamber (housing) 116 encloses a vacuum space 132 that surrounds the main magnet and is evacuated to a vacuum of, for example, $10^{-5}$ Torr or lower pressure (i.e., higher vacuum) by a vacuum system (not shown) comprising one or more vacuum pumps coupled to vacuum space 132 via one or more ports, valves and/or feedthroughs, etc. Vacuum chamber housing 116 may be made of aluminum, stainless steel, or other metallic or other non-metallic material, such as glass, ceramic, plastics, or combination of these materials. As will be understood by those skilled in the art, vacuum space 132 provides thermal isolation between the cold main magnet and the room temperature wall of vacuum chamber housing 116.

The main magnetic coil 104, as well as the correction coils 106, may be implemented as a low temperature superconductor (LTS) or as a high temperature superconductor (HTS). A LTS main magnet may be made using LTS wire, including, for example, NbTi, $Nb_3Sn$, $Nb_3Al$, $MgB_2$, and other low temperature superconductor wires. An HTS main magnet may be made using HTS tape, including, for example, one or more of YBCO, BSCCO, and other high-temperature superconductor tapes with critical temperature above 77K. As understood by those skilled in the art, one or more sets of correction coils 106 may be provided for the purpose of achieving greater magnetic field uniformity. Such correction coils are typically designed to carry only a small fraction of the current carried by the main superconductive coils, and/or have a small fraction of the number of turns of the main superconductive coils, and the field contribution of a correction coil is designed to be nonuniform, so that in combination with the main magnetic field, the field of the correction coil acts to reduce overall magnetic field nonuniformity.

The superconducting magnet coils 104, as well as the superconducting correction coils 106, are wound onto main magnetic coil frame 108, which may be made from one or more materials such as stainless steel, aluminum, FR4 (e.g., self-extinguishing flammable G10), or other mechanically strong materials. The main magnetic coil frame is mounted in good thermal contact to thermal sink 110, which is thermally coupled to cryogenic system 160 such that heat is conducted from the main magnet, via thermal sink 110, to cryogenic system 160. Materials suitable for making the thermal sink 110 include, for example, alumina, sapphire, and metal.

In some embodiments such as depicted in FIGS. 1A and 1B, cryosystem 160 may be implemented as a two-stage system comprising a cryocooler 162, a first stage 164, a second stage 168, wherein the first stage 164 is connected to thermal shield 114 and the second stage is connected to the thermal sink 110 and/or to a cryogen, such as liquid helium, contained within cryogen container 112. In some embodiments, cryogen container 112 may not be implemented, as cooling may be provided via thermal sink 110 without using a surrounding cryogen. The temperatures of the first and second stage of the cryocooler are, for example, 40 K and 20 K, respectively, or 77 K and 40 K, respectively, or various other combinations as desired, depending on various design parameters, such as the material used for the superconducting magnet, the type of cryosystem employed, heat sources or loads, etc. Accordingly, thermal shield 114 has a temperature between the room temperature vacuum wall and low temperature magnet coil, and thus, it will prevent radiation from the room temperature vacuum wall from heating the superconductor main magnet. Some embodiments, however, may employ more than one layer of thermal shielding or, alternatively, may not employ a thermal shield 114.

In various embodiments, cryogenic system 160 may be implemented as any of various single stage or multi-stage cryocoolers, such as, for example, a Gifford McMahon (GM) cryocooler, a pulse tube (PT) cooler, a Joule-Thomson (JT) cooler, a Stirling cooler, or other cryocooler may As shown in FIG. 1A, magnet/coil housing 130 also includes a second vacuum chamber that comprises an interior portion of vacuum chamber housing 116, an end-wall portion of magnet/coil housing 130, and an interior wall 150, and that encloses a vacuum space 142, gradient coils 103, and RF coil 105. The vacuum chamber enclosing vacuum space 142 is coupled to a high vacuum pumping system to establish a low pressure (e.g., high vacuum condition) during manufacture, and is sealed after a high vacuum has been reached. RF coil 105 and gradient coils 103 are each in thermal contact with a common heat sink 110, which is thermally coupled to a cryogenic system 170 comprising a cryocooler 172 and a second stage 174 having one end thermally coupled to the heat sink 110 and its other end thermally coupled to the cryocooler 172. Illustrative materials suitable for making the heat sink include ceramic such as alumina, crystals such as sapphire and metal, and glass.

In accordance with some embodiments of the present invention, a second interior wall 152 is provided to form another vacuum space 154, which provides additional thermal isolation, thus also enhancing user comfort with respect to temperature. Vacuum space 154 may be coupled to a vacuum pump or may be implemented as a hermetically sealed chamber. The radial extent (i.e., with respect to cylindrical coordinates corresponding to the generally cylindrical shape of the main magnet) of vacuum space 154 is generally minimized so as to ensure that the RF coil 105 is maintained close to the examination region. Illustrative materials for the interior walls 150 and 152 include G10 fiberglass, glass, glass composites, or a combination of these materials. As known, these materials are non-magnetic and will not interfere with the gradient fields or RF signal in the examination region.

In this configuration, where the superconductive RF coil 105 and the superconductive gradient coils 103 are both commonly cooled, more typically RF coil 105 and gradient coils 103 are implemented as the same type of superconductor, namely, either HTS or LTS (although it is nevertheless possible to implement one of these elements as HTS and the other as LTS, provided they are cooled below the critical LTS temperature). A suitable form of an HTS RF coil and HTS gradient coils for this application is a superconductor tape made by, for example, Bismuth Strontium Copper Oxides (BSCCO). For example, detailed teaching of fabricating HTS RF coils from HTS tape is described in U.S. Pat. No. 6,943,550, the disclosure of which is incorporated herein by reference. In alternative embodiments, the superconductor RF coil may be implemented as a superconductor thin film, such as a superconductor thin film comprising an HTS material such as Yttrium Barium Copper Oxide (YBCO), Thallium-Barium-Calcium-Copper Oxide (TBCCO), MgB2, or MB, wherein M is selected from the group consisting of Be, Al, Nb, Mo, Ta, Ti, Hf, V, and Cr. Detailed teaching of fabricating HTS film coil on a flat substrate is described in Ma et al, "Superconducting MR Surface Coils for Human Imaging," Proc. Mag. Res. Medicine, 1, 171 (1999) and the disclosure of which is incorporated herein by reference in its entirety. Additional teachings concerning HTS coils are described in Ma et al., "Superconducting RF Coils for Clinical MR Imaging at Low Field," Academic Radiology, vol. 10, no., 9, September 2003, pp. 978-987, and in Miller et al., "Performance of a High Temperature Superconducting Probe for In Vivo Microscopy at 2.0 T," Magnetic Resonance in Medicine, 41:72-79 (1999), the disclosures of which are incorporated herein by reference in their entirety.

As will be understood by those skilled in the art, RF coil 105 may be implemented as separate coils for the RF transmitter and the RF receiver, or as a common coil for both the transmitter and the receiver (i.e., a transceiver coil). Additionally, in some embodiments where the transmitter and receiver coils are separate coils, only one of the coils (e.g., the receiver coil) may be implemented as a superconducting coil (e.g., the other coil may be implemented as a conventional copper coil). Additionally, in some embodiments, superconductive RF coil 105 may be implemented as a coil array, such as an HTS coil array.

In some alternative embodiments of the present invention, one or more of the RF coils (e.g., the transmitter coil or the receiver coil, if implemented as separate coils) may be implemented as a non-superconducting coil that is formed from one or more materials that when cooled to a given temperature (e.g., cryogenically cooled, refrigerated, water cooled, thermoelectrically cooled, etc.) has a higher conductivity than that of copper at the given temperature. Such non-superconducting coils may be implemented, for example, from semiconductor two-dimensional electron gas (2DEG) material structures (e.g., GaAs and/or InP based), carbon nano-tubes, and other metals. As used herein, for purposes of distinguishing between cryogenics and refrigeration, a temperature approximately equal to or lower than about −73.3° C. (−100° F.) may be considered as being cryogenic.

Referring now to FIG. 2A, the gradient coils 103 of the illustrative superconductor MRI system of FIGS. 1A and 1B are depicted in more detail in an oblique view, in accordance with some embodiments of the present invention. In such embodiments, as depicted in FIG. 2A, three independent gradient coils for creating magnetic field variations along three orthogonal directions are formed or otherwise provided on and/or within the surfaces of three respective coaxial cylindrical support structures, namely, x-gradient support 258, y-gradient support 262, and z-gradient support 264. In accordance with typical convention, x- and y- indicate the two orthogonal directions perpendicular to the main magnetic field, and z- indicates the direction of the main magnetic field. Thus, the x-gradient support 258, y-gradient support 262, and z-gradient support 264 support respective gradient coils for providing magnetic field gradients along the x-, y-, and z-directions, respectively. The gradient supports 258, 262, and 264 may be made of, for example, G10 or other non-ferromagnetic, non-conductive (e.g., non-metallic, insulating) material. In this embodiment, the z-gradient coil is a solenoid coil, and the x- and y-gradient coils are saddle coils that each span or cover about half of their respective cylindrical supports in the circumferential direction. The y-gradient support 262 is mounted in good thermal contact to x-gradient support 258 and to z-gradient support 264, which is mounted in good thermal contact to thermal sink 110. In various alternative embodiments, a heat sink may be additionally or alternatively mounted in contact with x-gradient support 258. When implemented in addition to thermal sink 110, such a heat sink in contact with x-gradient support 258 may be cooled either by cryocooler 172 (i.e., the same cryocooler that cools thermal sink 110) or by a separate cryocooler. When implemented as an alternative to thermal sink 110 for cooling the gradient coils, thermal sink 110 may be thermally decoupled (e.g., spatially separated) from z-gradient support 264, while still being thermally coupled to RF coil 105 for cooling the RF coil 105.

FIG. 2B schematically illustrates cylindrical x-gradient support 258 of FIG. 2A depicted in a plan view, showing the x-gradient coil 268 that is supported by x-gradient support 258, in accordance with an embodiment of the present invention. The surface of the x-gradient support 258 is usually recessed (e.g., etched or carved) where the gradient coil 268 (wire) is located, and the gradient coil wire is fixed and bonded in the recess so the wire will not move when current conducts through the gradient coil wire in the magnetic field (e.g., resulting in a Lorentz force). The y-oriented gradient coil provided on y-gradient support 262 has essentially the same design and construction as the x-oriented gradient coil 268 on x-gradient support 258, except for slight dimensional variations to account for the slightly smaller diameter of the y-gradient support compared to that of the x-oriented gradient support. The center 260 of the x-gradient coil 268 is facing the x-direction as indicated by FIGS. 2A and 2B, and the y-gradient coil is displaced 90° circumferentially relative to the x-gradient coil. The solenoidal z-gradient coil (not shown in detail) is similarly fabricated on and/or within the surface of the z-gradient support 264, but with the z-gradient coil wound helically about the cylindrical axis of z-gradient support 264, with half of the coil along the cylindrical axis wound in the same direction as the main magnet winding such that the z-gradient coil increases the magnetic field within this half of the coil, and with the other half of the coil along the cylindrical axis wound in the opposite direction such that the z-gradient coil decreases the magnetic filed within this other half of the coil.

In some embodiments, as further discussed hereinbelow, gradient coils 103 and RF coil 105 may be separately cooled and thermally isolated from each other, which may be desirable, for example, to provide different operating temperatures for the gradient coils and the RF coil (e.g., when different materials are used for these elements). Such alternative embodiments may include disposing the RF coils and the gradient coils either in a common vacuum chamber or in separate vacuum chambers.

In some embodiments, such as the embodiments discussed above in connection with FIGS. 1A and 1B, the main magnet, the gradient coils, and the RF coil are all implemented as superconductors, and each of these components may be implemented as either HTS or LTS, thus providing for eight (8) possible permutations, assuming all of the gradient coils are implemented with the same type of superconductor (i.e., either HTS or LTS). In accordance with some preferred embodiments of the present invention, the main magnet, the gradient coils, and the RF coil are each implemented with HTS materials. As will be appreciated by those skilled in the art, such an all-HTS configuration provides many advantages in terms of providing for a cost-effective, high quality, high performance MRI system.

For instance, superconducting main magnets made from low temperature superconductors are generally very bulky and heavy. A main magnet made of HTS in accordance with various embodiments of the present invention, however, is comparatively much lighter and more compact as, for example, the same magnetic field magnitude may be achieved with less HTS wire than LTS wire. Additionally, because it can be operated at a much higher temperature (e.g., 77K) than an LTS magnet (e.g., around 10-20 K), an HTS main magnet uses much less cryogen and hence reduces cost substantially. Similarly, implementing both the gradient and RF coils with HTS materials also reduces cooling costs while also simplifying thermal and vacuum isolation design compared to embodiments of the present invention that employ LTS materials for the gradient coils and/or RF coils. At the same time, compared to conventional copper RF coils and gradient coils, overall MRI system performance is significantly enhanced due, in part, to the HTS RF coils providing for high sensitivity (e.g., reduced coil noise and hence higher SNR), while the HTS gradient coils provide for high drive currents, rapid switching, and significantly reduced heat dissipation.

Figure 3A:
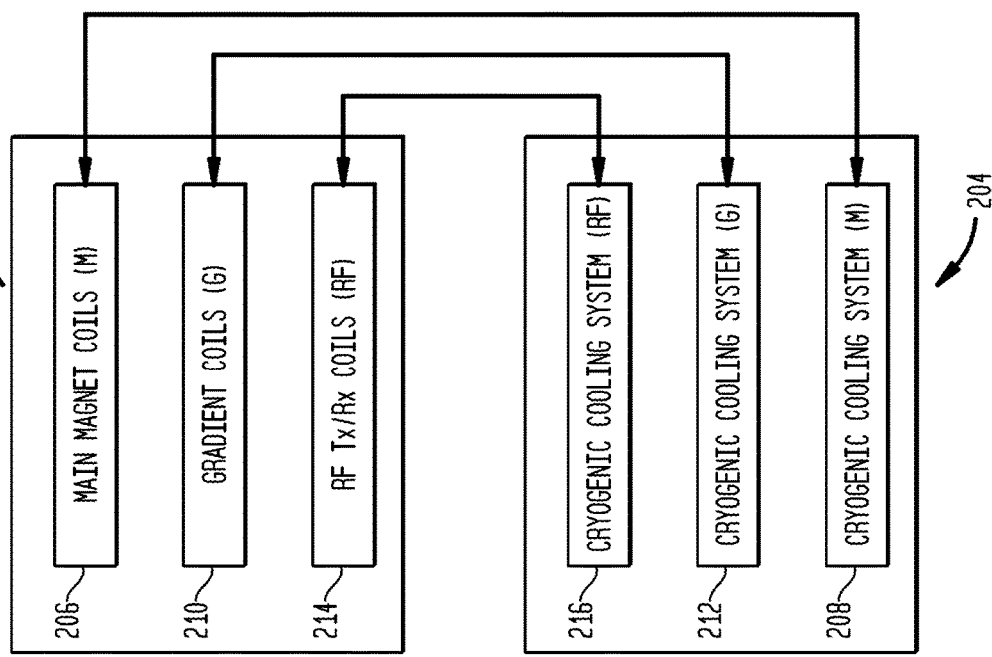

Referring now to FIGS. 3A-3D, schematically depicted are different examples of cooling configurations that may be used within an MRI system according to various embodiments of the present invention. As shown in FIG. 3A, each of the superconducting coils 202 are individually cooled within their own cooling chamber by a separate cryogenic cooling system 204. Main magnet coils 206 are cooled to exhibit HTS or LTS characteristics under the control of cryogenic cooling system 208. Similarly, gradient coils 210 are cooled to exhibit HTS or LTS characteristics under the control of cryogenic cooling system 212. Also, RF coils 214 are cooled to exhibit HTS or LTS characteristics under the control of cryogenic cooling system 216.

As shown in FIG. 3B, the main magnet coils 220 are cooled to exhibit HTS or LTS characteristics under the control of cryogenic cooling system 222. However, gradient coils 226 and RF coils 228 are cooled to exhibit HTS or LTS characteristics under the control of common cryogenic cooling system 230. Within this embodiment, the coils are all cooled within their own individual cooling chamber.

Figure 3D:
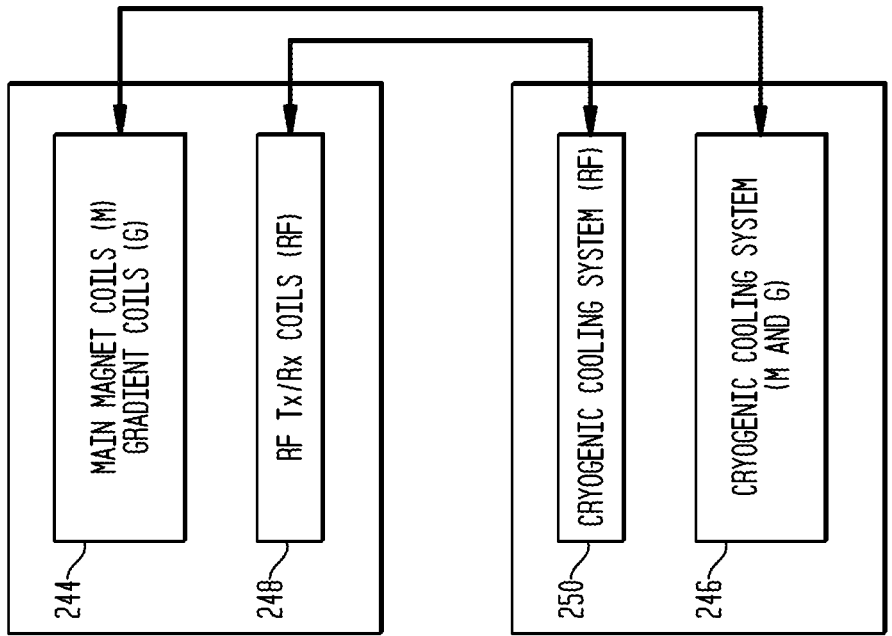
Figure 3C:
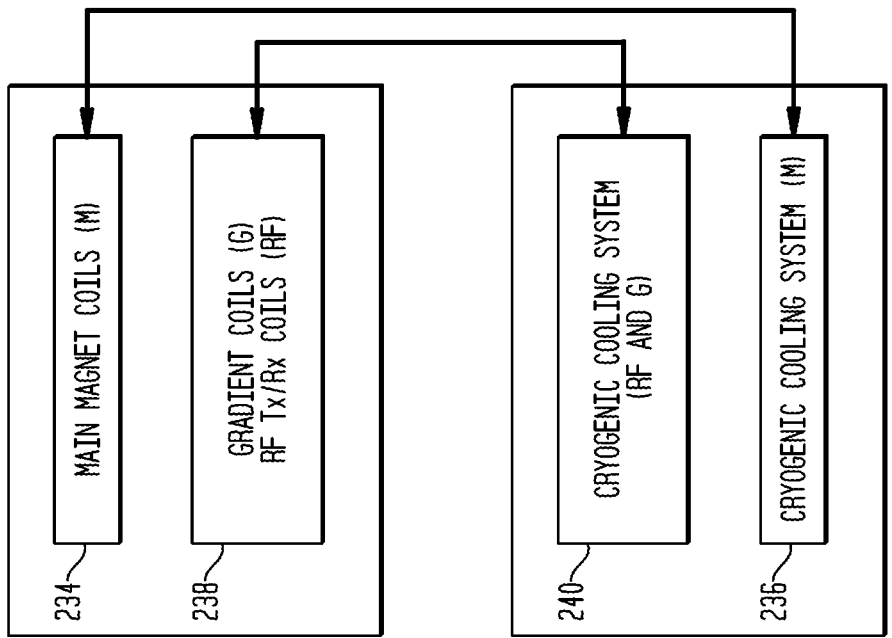

As shown in FIG. 3C, the main magnet coils 234 are cooled to exhibit HTS or LTS characteristics under the control of cryogenic cooling system 236, whereby coils 234 are cooled within their own cooling chamber. However, both the gradient and RF coils 238 are cooled to exhibit HTS or LTS characteristics under the control of common cryogenic cooling system 240. With this embodiment, both the gradient and RF coils 238 are cooled within the same cooling chamber.

As shown in FIG. 3D, the main magnet and gradient coils 244 are both cooled to exhibit HTS or LTS characteristics under the control of individual cryogenic cooling system 246, whereby coils 244 are both cooled within the same cooling chamber. The RF coils 248, however, are cooled to exhibit HTS or LTS characteristics under the control of individual cryogenic cooling system 250, whereby the RF coils 248 are cooled within a separate cooling chamber to that of the main magnet and gradient coils 244.

Additionally, as will be understood by those skilled in the art in view of the foregoing, various embodiments of the present invention may be implemented with the main magnet, gradient coils, and RF coil being cooled by a common cryocooler, regardless of whether the main magnet, gradient coils, and RF coils are each disposed in separate (respective) vacuum isolated cooling chambers, or are disposed in two vacuum isolated cooling chambers (e.g., gradient coils and RF coil(s) in same chamber), or are disposed in a common vacuum isolated cooling chamber.

Figure 4A:
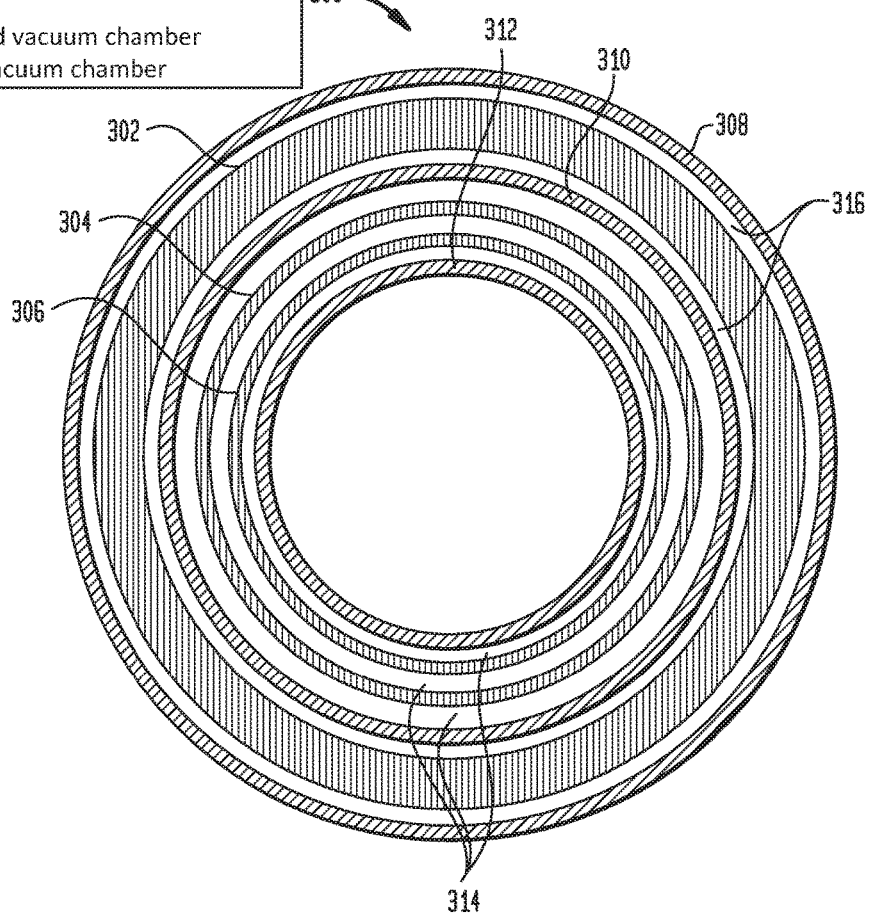

FIG. 4A illustrates a first cross sectional view of an illustrative coil configuration 300 associated with a superconducting MRI system employing a cylindrical, solenoid main magnet structure (e.g., similar to MRI system 100 shown in FIG. 1A) according to some embodiments. The configuration 300 includes a first vacuum chamber 316, a second vacuum chamber 314, one or more main magnet coils 302, one or more gradient coils 304, one or more RF coils 306, and walls 308, 310, and 312. As will be understood in view of the further description below, in accordance with various embodiments, each of one or more of walls 308, 310, and 312 in configuration 300 may be implemented as a hermetically sealed double-walled structure, which, in some embodiments, may be implemented in accordance with, or similar to, the hermetically sealed double-walled structures (and vacuum thermal isolation housing) described in U.S. application Ser. No. 12/212,122, filed Sep. 17, 2008, and in U.S. application Ser. No. 12/212,147, filed Sep. 17, 2008, each of which is herein incorporated by reference in its entirety.

The first vacuum chamber 316 houses the super MRI magnet and its corresponding main magnet coil 302. Vacuum chamber 316 is formed between hermetically sealed double-walls 308 and 310, whereby the cavity within each of double-walls 308 and 310 is vacuum pumped, filled (optionally) with thermal insulation material (e.g., fiber glass), and appropriately sealed (e.g., via melding) to maintain a high-grade vacuum. The enclosure associated with the first vacuum chamber 316 is also evacuated using a suitable vacuum pump. The outer double-wall 308 of the first vacuum chamber 316 may be constructed from conventional vacuum chamber materials, such as, but not limited to, aluminum or stainless steel. The inner double-wall 310 of the first vacuum chamber 316 may, however, be produced from a non-magnetic and non-metallic material, such as, but limited to, glass, non-conductive ceramic, G10, FR4, or plastic.

As previously described, once a sufficient vacuum is created within the first vacuum chamber 316, a cryogenic cooling system is used to reduce the temperature of the main magnet coil 302. The required temperature reduction may depend on the coil material. By utilizing either low temperature superconducting (LTS) material or high temperature superconducting (HTS) materials in the construction of coil 302, its resistance is greatly reduced in comparison to conventionally cooled copper coils. The superconducting windings of main magnet coil 302 will, therefore, reduce the amount of heat generation/dissipation that occurs within the coil windings when driven by an established current necessary to generate a particular target magnetic field (e.g., 1 Tesla). Also, as a consequence, the amount of power required to generate and maintain the particular magnetic field by the main MRI magnet is reduced. Moreover, future MRI applications may lead to the use of higher magnetic field magnitudes (e.g., greater than 7 Tesla). Under such circumstances, the use of superconductive main magnet coils enables the generation of higher current densities in the coil and thus, increased magnetic field capabilities. The cryogenic cooling system may, for example, operate over a range of 20-40 Kelvin (K). Also, according to some embodiments, a superconducting main magnet coil may have a length of 0.5-3 meters (m), an outer diameter of 1-3 m, an inner diameter of 0.1-2.5 m, and a substantially cylindrical geometry.

The second vacuum chamber 314 houses both the gradient coils 304 and the RF coils 306. Vacuum chamber 314 is formed between hermetically sealed double-walls 310 and 312, whereby the cavity within each of double-walls 310 and 312 is also vacuum pumped, filled (optionally) with thermal insulation material (e.g., fiber glass), and appropriately sealed (e.g., via melding) to maintain a high-grade vacuum. The enclosure associated with the second vacuum chamber 314 is also evacuated using a suitable vacuum pump. The outer double-wall 310 of the second vacuum chamber 314 is produced from a non-magnetic and non-metallic material, such as, but limited to, glass, non-conductive ceramic, G10, FR4, or plastic. The inner double-wall 312 of the second vacuum chamber 314 is, however, materially constructed to have no screening effect on RF signals transmitted by and received from the RF coils 306, and produces no eddy current effects that may result from the application of gradient signals to the gradient coils 304.

Once a sufficient vacuum is created within the second vacuum chamber 314, another cryogenic cooling system is used to reduce the temperature of either or both the gradient coils 304 and RF coils 306. As previously mentioned, the required temperature reduction may depend on the coil material. By utilizing either low temperature superconducting (LTS) material or high temperature superconducting (HTS) materials in the construction of coils 304 and/or 306, there respective resistances are greatly reduced in comparison to conventionally cooled copper coils or other such non-superconducting materials. The superconducting windings of gradient coils 304 (LTS or HTS) minimizes/reduces the amount of gradient heating, and allows for rapid switching of high gradient fields. Thus, faster image acquisition (increased temporal resolution) and a reduction in additional cooling requirements for dissipating gradient coil generated heat are realized. The cryogenic cooling system associated with cooling the gradient coils 304 may, for example, operate over a range of 40-60 Kelvin (K). According to some embodiments, a superconducting gradient coil may include a length of 0.2-2 meters (m), an outer diameter of 0.1-2.5 m, an inner diameter of 0.02-2.3 m, and a cylindrical solenoid and saddle geometry. A superconducting RF coil (HTS) may include a length of 0.01-0.5 m, an outer diameter of 0.02-1.0 m, an inner diameter of 0.01-0.8 m, and a cylindrical solenoid and saddle geometry. The superconducting RF coils 306 reduce the coil noise. This in turn results in an increased S/N performance within the RF receiver circuitry (provided that the sample noise does not overwhelm the coil noise), which provides for faster acquisition and/or improved image resolution capture. The cryogenic cooling system associated with cooling the gradient coils 304 and RF coils may, for example, operate over a range of 40-60 Kelvin (K). FIG. 4B illustrates a second cross sectional view of the exemplary coil configuration 300 taken along a longitudinal direction.

Many different HTS and LTS materials may be employed in the construction and operation of the superconducting MRI system. For example, the gradient coils 304 may be constructed from Bi-223 tape, which is a commercial low-cost HTS material. In some instances, the Bi-223 tape may be sheathed by pure silver (Ag) in order to enhance its mechanical strength. When the Bi-223 tape is cooled by, for example, immersion in liquid nitrogen, it exhibits superconducting properties, whereby its resistance reduces to approximately zero. The superconducting RF coils 306, which can be configured as either a transceiver or discrete transmitter and receiver, may also be formed from HTS materials (e.g., YBaCuO, BiSrCaCuO, etc.), as well as other superconductors, nano-materials such as carbon nano-tubes, and two-dimensional electron gas (2DEG) materials/structures having high conductivity characteristics (e.g., using GaAs or InP material system based compounds). Alternatively or additionally, the HTS RF coils 306 may include an array of thin film coils, each having a substrate diameter of, for example, about 1 cm to 30 cm. The superconducting main magnet coils may be constructed from either HTS or LTS materials. For example, LTS materials such as $MgB_2$ (Magnesium Di-boride) may be used to form the main magnet coil 302. From a cooling perspective, the superconducting coils may be operated over different temperature ranges. For example, the superconducting main magnet coils 302 may be cooled over a range of about 20-40K. The superconducting gradient coils 304 may be cooled over a range of about 40-60 K, while the superconducting RF coils 306 may be maintained at higher temperatures ranging from about 40-60 K or at about 77K. Alternatively, both the superconducting gradient coils 304 and superconducting RF coils 306 may be cooled to around 77K, while the superconducting gradient coils 304 is cooled over a range of 20-40K. A myriad of different operating temperatures may be used. For example, according to some configurations, all the superconducting coils may be maintained around a temperature of 77K.

Although the described embodiments show the coils configured in a manner that provides a horizontal magnetic field, other MRI systems may incorporate structural designs that facilitate the generation of vertical magnetic fields of differing strength (e.g., 0.5 T. 1.0 T, etc.) across various fields of views (FOV). Such MRI system examples include, but are not limited to, an asymmetric head-scanning MRI incorporating a 6 or 8 RF coil array; an orthopedic MRI system (0.2-0.5 T system using a Helmholtz Coil Pair) for examination of hands of legs; or an open vertical field MRI system for scanning breasts, whereby the RF coils may be built into the examination bed. The open vertical field MRI system design concept may also be extended for examining animals. It may also be appreciated that while the MRI system embodiments described hereinabove are typically directed to detecting hydrogen atoms within the water of bodily tissue, it may be adapted to detect other nuclei.

The present invention has been illustrated and described with respect to specific embodiments thereof, which embodiments are merely illustrative of the principles of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with the claims that follow.

What is claimed is:

1. A system configured for magnetic resonance imaging (MRI) and/or magnetic resonance spectroscopy, the system comprising:
a superconducting main magnet operable to generate a uniform magnetic field in an examination region, wherein the superconducting main magnet is a cylindrical solenoid magnet comprising windings that extend over a longitudinal axis and surround a bore that is disposed interior thereto and that comprises said examination region;
at least one superconducting gradient field coil that is disposed between said examination region and said superconducting main magnet, and that is operable to apply a respective at least one magnetic field gradient within the examination region; and
at least one superconducting RF coil that is disposed between said examination region and said superconducting main magnet, and that is operable to transmit and receive radio frequency signals to and from the examination region;
wherein said superconducting main magnet, each of said at least one superconducting gradient field coil, and each of the at least one superconducting RF coil, each comprise a high temperature superconductive (HTS) material.

2. The system according to claim 1, wherein the same HTS material is used for said superconducting main magnet, each of said at least one superconducting gradient field coil, and each of the at least one superconducting RF coil.

3. The system according to claim 2, wherein the HTS material comprises bismuth strontium copper oxide (BSCCO) formed as a tape.

4. The system according to claim 1, wherein said at least one gradient coil and the at least one RF coil are disposed in at least one vacuum chamber having at least one non-magnetic and non-metallic wall disposed between the examination region and the gradient coil and the at least one RF coil, and wherein the at least one gradient coil and the at least one RF coil are disposed in a common vacuum chamber comprising said at least one non-magnetic and non-metallic wall.

5. The system according to claim 4, further comprising a further vacuum chamber disposed between said common vacuum chamber and the examination region, said further vacuum chamber comprising a first wall formed from said at least one non-magnetic and non-metallic wall, and a second non-magnetic and non-metallic wall spaced away from said first wall.

6. The system according to claim 1, wherein said at least one gradient coil and the at least one RF coil are disposed in at least one vacuum chamber having at least one non-magnetic and non-metallic wall disposed between the examination region and the gradient coil and the at least one RF coil, wherein said at least one vacuum chamber comprises a first vacuum chamber containing said at least one gradient coil, and a second vacuum chamber disposed between the first vacuum chamber and the examination region and containing said at least one RF coil, and wherein said at least one non-magnetic and non-metallic wall comprises a first non-magnetic and non-metallic wall disposed between the examination region and the gradient coil, and a second non-magnetic and non-metallic wall disposed between the examination region and the at least one RF coil.

7. The system according to claim 6, further comprising a further vacuum chamber disposed between said second vacuum chamber and the examination region, said further vacuum chamber comprising a first wall formed from said second non-magnetic and non-metallic wall, and a third non-magnetic and non-metallic wall spaced away from said first wall.

8. The system according to claim 1, wherein said main magnet is disposed in a first vacuum chamber, and said at least one RF coil and said at least one gradient coil are disposed in a second vacuum chamber.

9. The system according to claim 1, wherein said main magnet, said at least one RF coil, and said at least one gradient coil are disposed in respective vacuum chambers.

10. The system according to claim 1, wherein said at least one RF coil and said at least one gradient coil are disposed in a common vacuum chamber.

11. The system according to claim 10, wherein said at least one RF coil and said at least one gradient coil are thermally coupled to a common heat sink.

12. The system according to claim 1, wherein said at least one RF coil comprises an RF coil array.

13. The system according to claim 1, wherein the at least one RF coil comprises a single RF coil operable as both a transmitter and a receiver.

14. The system according to claim 1, wherein the at least one RF coil comprises a transmitter RF coil and a receiver RF coil.

15. The system according to claim 1, wherein said superconducting main magnet is configured for cooling by a first cryogenic cooling system, said at least one RF coil is configured for cooling by a second cryogenic cooling system, and said at least one gradient coil is configured for cooling by a third cryogenic cooling system, wherein the first, second, and third cryogenic cooling systems are part of the system configured for MRI and/or magnetic resonance spectroscopy.

16. The system according to claim 1, wherein said superconducting main magnet is configured for cooling by a first cryogenic cooling system, and said at least one RF coil and said at least one gradient coil are configured for cooling by a second cryogenic cooling system, wherein the first and second cryogenic cooling systems are part of the system configured for MRI and/or magnetic resonance spectroscopy.

17. The system according to claim 1, wherein said at least one superconducting gradient field coil comprises three superconducting gradient field coils that are configured to provide magnetic field gradients in three respective orthogonal directions, wherein one of the directions is along the direction of the uniform magnetic field generated in the examination region by the superconducting main magnet.

* * * * *